(12) United States Patent
Le et al.

(10) Patent No.: US 11,843,054 B2
(45) Date of Patent: Dec. 12, 2023

(54) VERTICAL ARCHITECTURE OF THIN FILM TRANSISTORS

(71) Applicant: Intel Corporation, Santa Clara, CA (US)

(72) Inventors: Van H. Le, Portland, OR (US); Seung Hoon Sung, Portland, OR (US); Benjamin Chu-Kung, Portland, OR (US); Miriam Reshotko, Portland, OR (US); Matthew Metz, Portland, OR (US); Yih Wang, Portland, OR (US); Gilbert Dewey, Beaverton, OR (US); Jack Kavalieros, Portland, OR (US); Tahir Ghani, Portland, OR (US); Nazila Haratipour, Hillsboro, OR (US); Abhishek Sharma, Hillsboro, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 895 days.

(21) Appl. No.: 16/016,381

(22) Filed: Jun. 22, 2018

(65) Prior Publication Data

US 2019/0393356 A1 Dec. 26, 2019

(51) Int. Cl.
| | |
|---|---|
| H01L 29/786 | (2006.01) |
| H01L 29/417 | (2006.01) |
| H01L 29/423 | (2006.01) |
| H01L 23/522 | (2006.01) |
| H01L 29/66 | (2006.01) |
| H01L 29/49 | (2006.01) |
| H10B 12/00 | (2023.01) |

(52) U.S. Cl.
CPC .... *H01L 29/78642* (2013.01); *H01L 23/5226* (2013.01); *H01L 29/41733* (2013.01); *H01L 29/42384* (2013.01); *H01L 29/4908* (2013.01); *H01L 29/66742* (2013.01); *H01L 29/78603* (2013.01); *H01L 29/78645* (2013.01); *H10B 12/05* (2023.02); *H10B 12/30* (2023.02)

(58) Field of Classification Search
CPC .. H01L 29/78642; H01L 27/088; H10B 12/05
See application file for complete search history.

(56) References Cited

U.S. PATENT DOCUMENTS

| | | | | |
|---|---|---|---|---|
| 5,627,390 A | * | 5/1997 | Maeda | H01L 29/78642 257/302 |
| 5,943,574 A | * | 8/1999 | Tehrani | H01L 29/6675 438/300 |
| 2005/0041457 A1 | * | 2/2005 | Forbes | H01L 27/108 257/E21.654 |

* cited by examiner

*Primary Examiner* — Matthew L Reames
(74) *Attorney, Agent, or Firm* — Schwabe, Williamson & Wyatt, P.C.

(57) ABSTRACT

Embodiments herein describe techniques for a semiconductor device including a transistor. The transistor includes a first metal contact as a source electrode, a second metal contact as a drain electrode, a channel area between the source electrode and the drain electrode, and a third metal contact aligned with the channel area as a gate electrode. The first metal contact may be located in a first metal layer along a first direction. The second metal contact may be located in a second metal layer along the first direction, in parallel with the first metal contact. The third metal contact may be located in a third metal layer along a second direction substantially orthogonal to the first direction. The third metal layer is between the first metal layer and the second metal layer. Other embodiments may be described and/or claimed.

23 Claims, 9 Drawing Sheets

VERTICAL ARCHITECTURE OF THIN FILM TRANSISTORS

FIELD

Embodiments of the present disclosure generally relate to the field of integrated circuits, and more particularly, to transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A memory device, e.g., a dynamic random access memory (DRAM) array, may include a plurality of memory cells, where a memory cell may include a selector, e.g., a transistor, to control the access to a storage cell. When a silicon transistor is used as a selector, the silicon transistor may be very leaky, which may bring adverse impact to the performance of the storage cell.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs in the back-end, while leaving the silicon substrate areas for high-speed transistors. A TFT may be used as a selector for a memory cell in a memory device. However, a TFT may be difficult to scale with the advancing fabrication technologies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
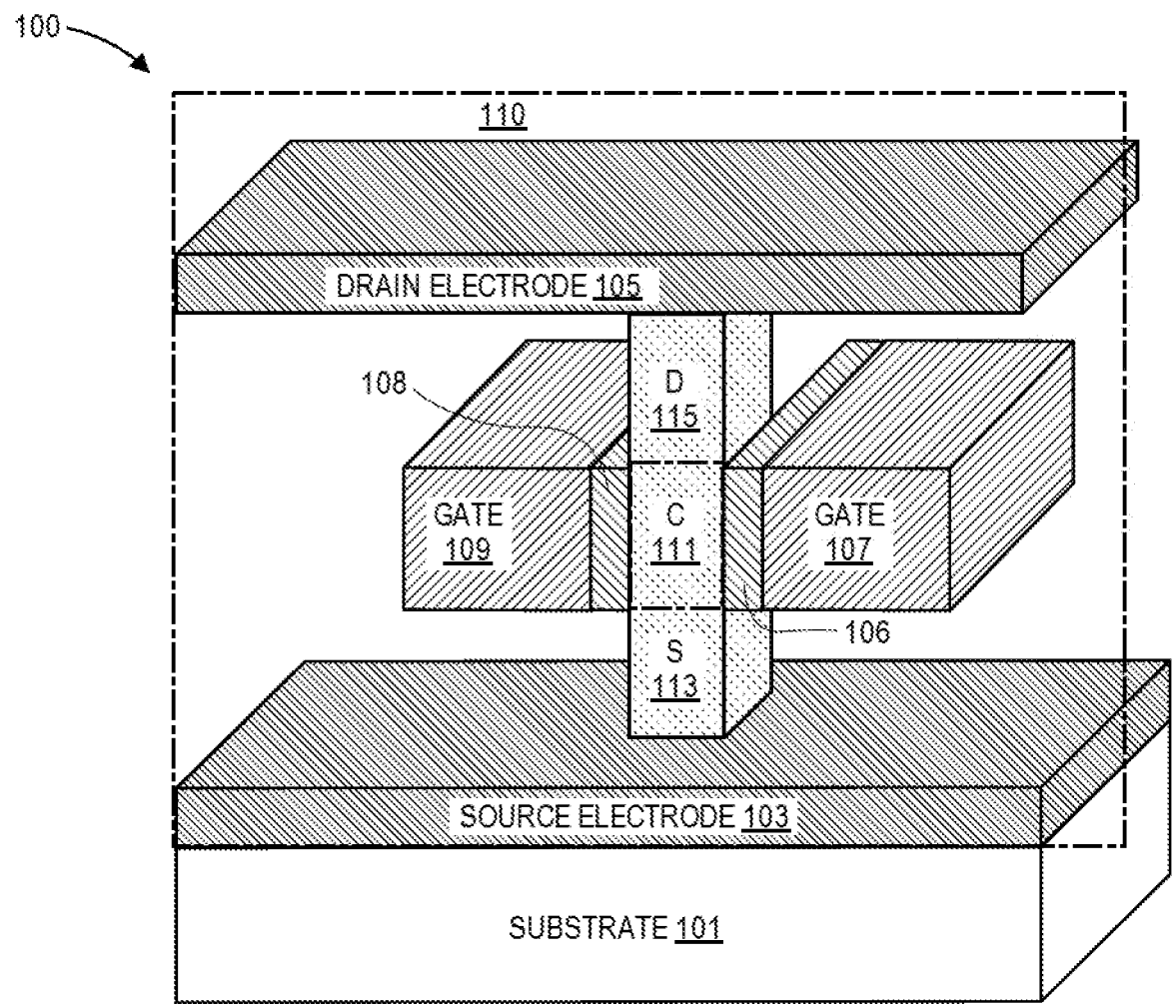
FIGS. 1(a)-1(b) schematically illustrate diagrams of a semiconductor device including a thin-film transistor (TFT) with a vertical architecture in multiple metal layers, in accordance with some embodiments.

Front-end-of-line (FEOL) semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL.

A thin-film transistor (TFT) is a kind of field-effect transistor formed at BEOL and including a channel layer, a gate electrode, and source and drain electrodes, over a supporting but non-conducting substrate. Conventionally, a TFT may have a single gate or multiple gates in a lateral geometry. As such, a TFT may have its size tied to critical device parameters such as a gate length, a channel area, or a source/drain contact area. With the scaling of minimal feature sizes, it becomes more difficult to control the fabrication of a TFT.

Embodiments herein may present techniques to form a TFT having a single gate or multiple gates in vertical architecture in multiple metal layers. A source electrode, a drain electrode, and a gate electrode of a TFT may be metal contacts located in three different metal layers. The source electrode and the drain electrode may be in parallel along a first direction, while the gate electrode may be along a second direction substantially orthogonal to the first direction. A TFT in such a vertical architecture can have a size of $4F^2$, where F is the minimal feature size of the technology for fabricating the TFT. Additional advantages for a TFT in vertical architecture in multiple metal layers may include better electrostatic control due to the independence of gate length and cell dimensions, easy integration of multiple TFTs in multiple metal layers, and individually designed source/drain contacts for resistor-capacitor (RC) circuit benefits.

Embodiments herein may present a semiconductor device, which may include a substrate and a transistor above the substrate. The transistor includes a first metal contact as a source electrode, a second metal contact as a drain electrode, a channel area between the source electrode and the drain electrode, and a third metal contact aligned with the channel area as a gate electrode. The first metal contact may be located in a first metal layer along a first direction. The second metal contact may be located in a second metal layer along the first direction, in parallel with the first metal contact. The third metal contact may be located in a third metal layer along a second direction substantially orthogonal to the first direction, wherein the third metal layer is between the first metal layer and the second metal layer.

In embodiments, a method for forming a semiconductor device may include: forming a first metal contact as a source electrode; forming a channel area above the source electrode; forming a second metal contact aligned with the channel area as a gate electrode; and forming a third metal contact as a drain electrode. The first metal contact may be located in a first metal layer along a first direction. The second metal contact may be located in a second metal layer along a second direction substantially orthogonal to the first direction, where the second metal layer is above the first metal layer. The third metal contact may be located in a third metal layer along the first direction, in parallel with the first metal contact, where the third metal layer is above the second metal layer.

Embodiments herein may present a computing device, which may include a circuit board, and a memory device coupled to the circuit board and including a memory array. The memory array includes a plurality of memory cells. A memory cell of the plurality of memory cells includes a transistor coupled to a storage cell. The transistor includes a first metal contact as a source electrode coupled to a source line of the memory array, a second metal contact as a drain electrode coupled to a first electrode of the storage cell, a channel area between the source electrode and the drain electrode, and a third metal contact aligned with the channel area as a gate electrode coupled to a word line of the memory array. The first metal contact may be located in a first metal layer along a first direction. The second metal contact may be located in a second metal layer along the first direction, in parallel with the first metal contact. The third metal contact may be located in a third metal layer along a second direction substantially orthogonal to the first direction, wherein the third metal layer is between the first metal layer and the second metal layer. The storage cell further includes a second electrode coupled to a bit line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
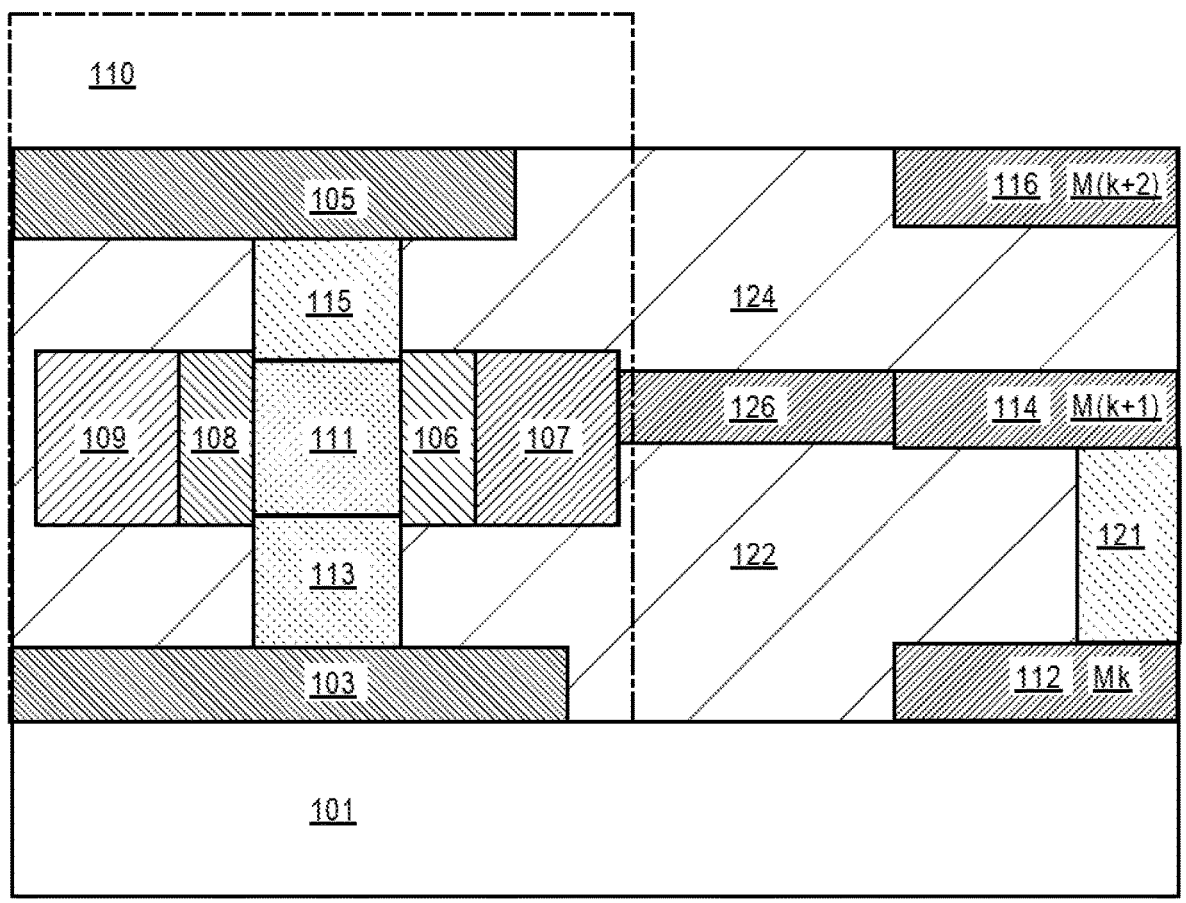

FIGS. 1(a)-1(b) schematically illustrate diagrams of a semiconductor device 100 including a TFT 110 with a vertical architecture in multiple metal layers, e.g., a metal layer 112, a metal layer 114, and a metal layer 116, in accordance with some embodiments. For clarity, features of the semiconductor device 100, the TFT 110, the metal layer 112, the metal layer 114, and the metal layer 116, may be described below as examples for understanding an example semiconductor device including a TFT with a vertical architecture in multiple metal layers. It is to be understood that there may be more or fewer components within a semiconductor device including a TFT with a vertical architecture in multiple metal layers. Further, it is to be understood that one or more of the components within a semiconductor device including a TFT with a vertical architecture in multiple metal layers may include additional and/or varying features from the description below, and may include any device that one having ordinary skill in the art would consider and/or refer to as a semiconductor device including a TFT with a vertical architecture in multiple metal layers.

In embodiments, the semiconductor device 100 includes the TFT 110 on a substrate 101. The TFT 110 includes multiple metal contacts, e.g., a metal contact as a source electrode 103, a metal contact as a drain electrode 105, a metal contact as a gate electrode 107, and a metal contact as a gate electrode 109. A channel area 111 is in between the source electrode 103 and the drain electrode 105. The gate electrode 107 and the gate electrode 109 are aligned with the channel area 111. The gate electrode 107 is separated from the channel area 111 by a gate dielectric layer 106, and the gate electrode 109 is separated from the channel area 111 by a gate dielectric layer 108. A source area 113 is between the channel area 111 and the source electrode 103, while a drain area 115 is between the channel area 111 and the drain electrode 105.

In embodiments, the source electrode 103, the drain electrode 105, the gate electrode 107, the gate electrode 109, may have a width equal to a minimal feature width for the TFT 100, e.g., around 10 nanometers (nms) in width or 10 nms in length. In some embodiments, the source electrode 103, the drain electrode 105, the gate electrode 107, the gate electrode 109 may have a length of about 100 nms. The source electrode 103 is located in a metal layer 112, which may be a metal k layer. The drain electrode 105 is located in a metal layer 116, which may be a metal (k+2) layer. The gate electrode 107 and the gate electrode 109 are located in a metal layer 114, which may be a metal (k+1) layer. In some other embodiments, there may be multiple metal layers between the metal layer 112 and the metal layer 116, where the gate electrode 107 and the gate electrode 109 located in the metal layer 114 may be in any metal layer between the metal layer 112 and the metal layer 116. An ILD layer 122 may be between the metal layer 112 and the metal layer 114, and an ILD layer 124 may be between the metal layer 114 and the metal layer 116, and separated from the ILD layer 122 by an etch stop layer 126. A via 121 may be between the metal layer 112 and the metal layer 114.

In embodiments, the source electrode 103 may be along a first direction, the drain electrode 105 may be along the first direction, in parallel with the source electrode 103. The gate electrode 107 and the gate electrode 109 may be along a second direction substantially perpendicular or orthogonal to the first direction. In detail, a first direction may be substantially perpendicular or orthogonal to a second direction when there is +/−10 degrees of orthogonality between the two directions. For example, the source electrode 103 and the drain electrode 105 may be in parallel along the x-direction, while the gate electrode 107 may be oriented in a y-direction substantially perpendicular or orthogonal to the x-direction when the gate electrode 107 may form 80 degree or 100 degree with the x-direction. Both the x-direction and y-direction are parallel to a surface of the substrate 101.

In embodiments, the substrate 101 may be a silicon substrate, a glass substrate, such as soda lime glass or borosilicate glass, a metal substrate, a plastic substrate, or another suitable substrate. The substrate 101 may include an inter-metal dielectric layer, or other devices, not shown for clarity.

In embodiments, the source electrode 103, the drain electrode 105, the gate electrode 107, the gate electrode 109, may be formed as a single layer or a stacked layer using one or more conductive films including a conductive material. For example, the source electrode 103, the drain electrode 105, the gate electrode 107, the gate electrode 109, may include molybdenum (Mo), gold (Au), platinum (Pt), ruthenium (Ru), iridium (Ir), titanium (Ti), aluminum (Al), copper (Cu), tantalum (Ta), tungsten (W), nickel (Ni), chromium (Cr), tantalum nitride (TaN), titanium nitride (TiN), iridium-tantalum alloy (Ir—Ta), indium-tin oxide (ITO), the like, an alloy of Ti, Mo, Au, Pt, Al Ni, Cu, Cr, TiAlN, HfAlN, or InAlO, a combination thereof, or another conductive material.

In embodiments, the gate dielectric layer 106 or the gate dielectric layer 108 may include silicon and oxygen; silicon and nitrogen; yttrium and oxygen; silicon, oxygen, and nitrogen; aluminum and oxygen; hafnium and oxygen; tantalum and oxygen; or titanium and oxygen. For example, the gate dielectric layer 106 or the gate dielectric layer 108 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other dielectric materials.

In embodiments, the channel area 111 may include amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Figure 2:
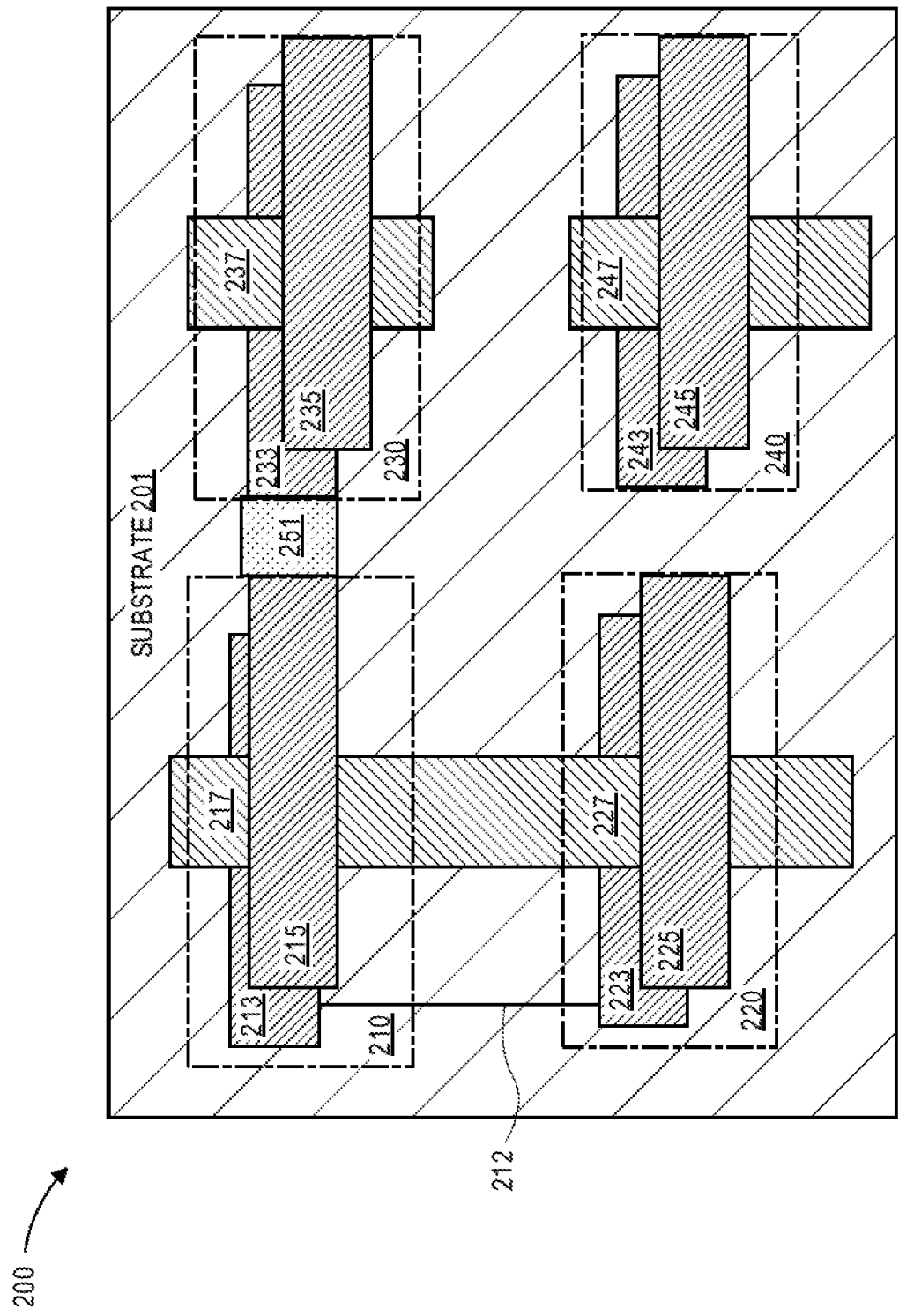
FIG. 2 schematically illustrates a diagram of a semiconductor device including multiple TFTs with a vertical architecture in multiple metal layers, in accordance with some embodiments.

FIG. 2 schematically illustrates a diagram of a semiconductor device 200 including multiple TFTs, e.g., a TFT 210, a TFT 220, a TFT 230, a TFT 240, with a vertical architecture in multiple metal layers, in accordance with some embodiments. The TFT 210, the TFT 220, the TFT 230, and the TFT 240, may be an example of the TFT 110 in FIG. 1. Various layers in the TFT 210, the TFT 220, the TFT 230, and the TFT 240 may be similar to corresponding layers in the TFT 110 in FIG. 1.

In embodiments, the TFT 210, the TFT 220, the TFT 230, and the TFT 240, may be formed on a substrate 201. The TFT 210, the TFT 220, the TFT 230, and the TFT 240 may be formed in an array format. A via 251 may be used to couple the TFT 210 and the TFT 230. In addition, a metal contact may be shared between two TFTs, e.g., the TFT 210 and the TFT 220.

The TFT 210 includes multiple metal contacts, e.g., a metal contact as a source electrode 213, a metal contact as a drain electrode 215, and a metal contact as a gate electrode 217. The source electrode 213 may be located in a first metal layer. The drain electrode 215 may be located in a second metal layer. The gate electrode 217 may be located in a third metal layer between the first metal layer and the second metal layer. The source electrode 213 may be along a first direction, the drain electrode 215 may be along the first direction, in parallel with the source electrode 213. The gate electrode 217 may be along a second direction substantially perpendicular or orthogonal to the first direction. As shown in FIG. 2, for purpose of illustration, the source electrode 213 and the drain electrode 215 are not strictly overlapped in top down view, so that it may be easier to describe the source electrode 213 and the drain electrode 215. In some embodiments, the source electrode 213 and the drain electrode 215 may strictly overlap in top down view. In addition, the TFT 210 may include other components, e.g., a channel area between the source electrode 213 and the drain electrode 215, a source area between the channel area and the source electrode 213, a drain area between the channel area and the source electrode 215, and other components of a transistor, not shown for clarity purpose.

In embodiments, the TFT 220 may be a TFT including metal contacts as a source electrode 223, a drain electrode 225, and a gate electrode 227. The gate electrode 227 may be shared as one long metal contact for the gate electrode 217 of the TFT 210. In addition, the source electrode 223, the drain electrode 225, and the gate electrode 227 are located in a same metal layer as the source electrode 213, the drain electrode 215, and the gate electrode 217, respectively. In detail, the source electrode 223 is located in the first metal layer, the drain electrode 225 is located in the second metal layer, and the gate electrode 227 is located in the third metal layer. The source electrode 223 may be separated from the source electrode 213 in the first metal layer along the first direction by a gap 212 of minimal feature width for the semiconductor device 200.

In embodiments, the source electrode 223 may be along the first direction, the drain electrode 225 may be along the first direction, in parallel with the source electrode 223. The gate electrode 227 may be along the second direction substantially perpendicular or orthogonal to the first direction. In addition, the TFT 220 may include other components, e.g., a channel area between the source electrode 223 and the drain electrode 225, a source area between the channel area and the source electrode 223, a drain area between the channel area and the source electrode 225.

In embodiments, the TFT 230 may be a TFT including metal contacts as a source electrode 233, a drain electrode 235, and a gate electrode 237. In addition, the source electrode 233, the drain electrode 235, and the gate electrode 237 may be located in metal layers different from those metal layers for the source electrode 213, the drain electrode 215, and the gate electrode 217 of the TFT 210, respectively. In detail, the source electrode 233 may be located in a fourth metal layer along the first direction, the drain electrode 235 may be located in a fifth metal layer along the first direction, in parallel with the source electrode 233, and the gate electrode 237 may be located in a sixth metal layer along the second direction substantially orthogonal to the first direction, where the sixth metal layer is between the fourth metal layer and the fifth metal layer. The via 251 may be used to couple the source electrode 233 of the TFT 230 with the drain electrode 215 of the TFT 210. In addition, the TFT 230 may include other components, e.g., a channel area between the source electrode 233 and the drain electrode 235, a source area between the channel area and the source electrode 233, a drain area between the channel area and the source electrode 235.

In embodiments, the TFT 240 may be a TFT including metal contacts as a source electrode 243, a drain electrode 245, and a gate electrode 247. The source electrode 243 may be along the first direction, the drain electrode 245 may be along the first direction, in parallel with the source electrode 243. The gate electrode 247 may be along a second direction substantially perpendicular or orthogonal to the first direction. In addition, the TFT 240 may include other components, e.g., a channel area between the source electrode 243 and the drain electrode 245, a source area between the channel area and the source electrode 243, a drain area between the channel area and the source electrode 245.

Figure 3:
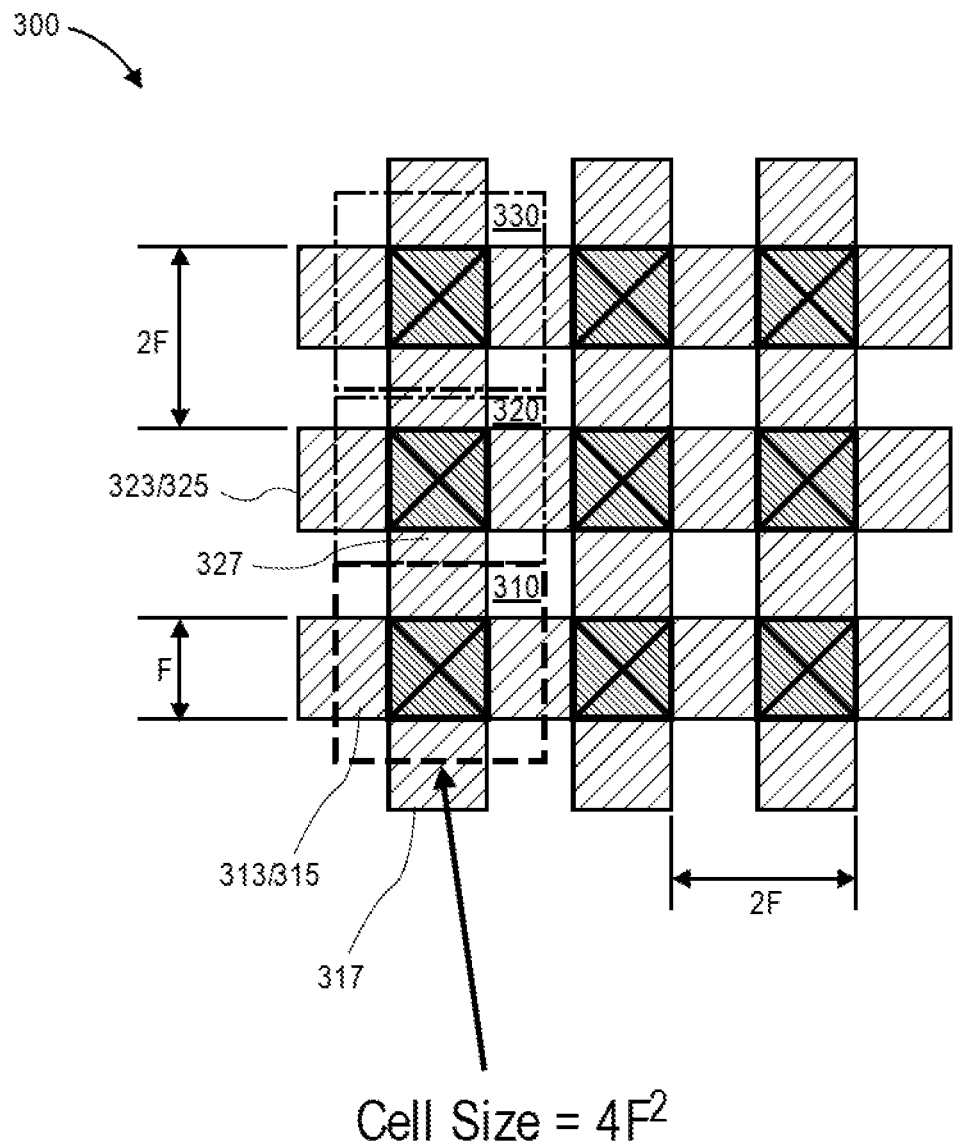
FIG. 3 schematically illustrates a diagram of a semiconductor device including multiple TFTs with a vertical architecture in multiple metal layers, in accordance with some embodiments.

FIG. 3 schematically illustrates a diagram of a semiconductor device 300 including multiple TFTs, e.g., a TFT 310, a TFT 320, a TFT 330, with a vertical architecture in multiple metal layers, in accordance with some embodiments. The TFT 310, the TFT 320, and the TFT 330 may be examples of the TFT 210, the TFT 220, the TFT 230, and the TFT 240 of FIG. 2, or examples of the TFT 110 in FIG. 1.

In embodiments, the TFT 310 may be a TFT including metal contacts as a source electrode 313, a drain electrode 315, and a gate electrode 317. The source electrode 313 and the drain electrode 315 may be along a first direction in parallel with each other, and located in a first metal layer and a second metal layer. The gate electrode 317 may be along a second direction substantially perpendicular or orthogonal to the first direction, and located in a third metal layer between the first metal layer and the second metal layer.

In embodiments, the TFT 320 may be a TFT including metal contacts as a source electrode 323, a drain electrode 325, and a gate electrode 327. The source electrode 323 and the drain electrode 325 may be along a first direction in parallel with each other, and located in two different metal layers. The gate electrode 327 may be along a second direction substantially perpendicular or orthogonal to the first direction, and located in a metal layer between the two metal layers for the source electrode 323 and the drain electrode 325.

In embodiments, the source electrode 313, a drain electrode 315, the gate electrode 317, the source electrode 323, the drain electrode 325, and the gate electrode 327 may have a width equal to a minimal feature width F for the semiconductor device 300. In addition, the gap between the source electrode 313 and the source electrode 323 may also be equal to a minimal feature width F. Accordingly, the TFT 310 may occupy an area of $2F*2F=4F^2$. Other TFTs, e.g., the TFT 320 or the TFT 330 may occupy similar areas.

Figure 4:
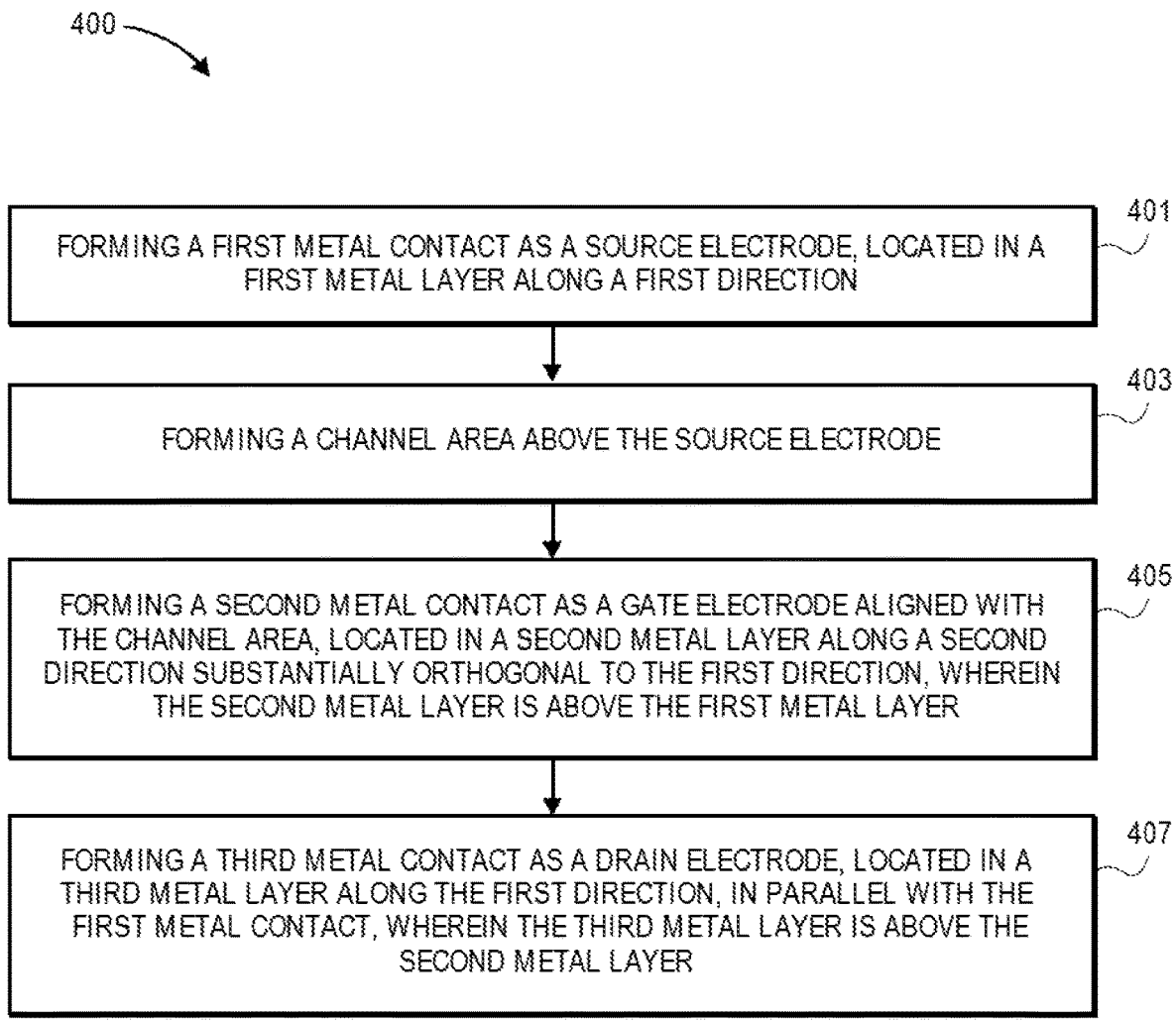
FIG. 4 illustrates a process for forming a semiconductor device including a TFT with a vertical architecture in multiple metal layers, in accordance with some embodiments.

FIG. 4 illustrates a process 400 for forming a semiconductor device including a TFT with a vertical architecture in multiple metal layers, in accordance with some embodiments. In embodiments, the process 400 may be applied to form the TFT 110 in FIG. 1, the TFT 210, the TFT 220, the TFT 230, or the TFT 240 in FIG. 2, the TFT 310, the TFT 320, or the TFT 330 in FIG. 3.

At block 401, the process 400 may include forming a first metal contact as a source electrode, located in a first metal layer along a first direction. For example, the process 500 may include forming a first metal contact as the source electrode 103, located in the metal layer 112 along a first direction as shown in FIG. 1.

At block 403, the process 400 may include forming a channel area above the source electrode. For example, the process 400 may include forming the channel area 111 above the source electrode 103, as shown in FIG. 1.

At block 405, the process 400 may include forming a second metal contact as a gate electrode aligned with the channel area, located in a second metal layer along a second direction substantially orthogonal to the first direction, wherein the second metal layer is above the first metal layer. For example, the process 400 may include forming a second metal contact as the gate electrode 107 aligned with the channel area 111. The gate electrode 107 is located in the metal layer 114 along a second direction substantially orthogonal to the first direction, where the metal layer 114 is above the metal layer 112.

At block 407, the process 400 may include forming a third metal contact as a drain electrode, located in a third metal layer along the first direction, in parallel with the first metal contact, wherein the third metal layer is above the second metal layer. For example, the process 400 may include forming a third metal contact as the drain electrode 105, located in the metal layer 116 along the first direction, in parallel with the first metal contact, wherein the metal layer 116 is above the metal layer 114.

In addition, the process 400 may include additional operations. For example, the process 400 may include forming a fourth metal contact as a second gate electrode, located in the second metal layer along the second direction in parallel to the first gate electrode, wherein the channel area is in between the first gate electrode and the second gate electrode. Furthermore, the process 500 may include forming a gate dielectric layer between the gate electrode and the channel area.

Figure 5:
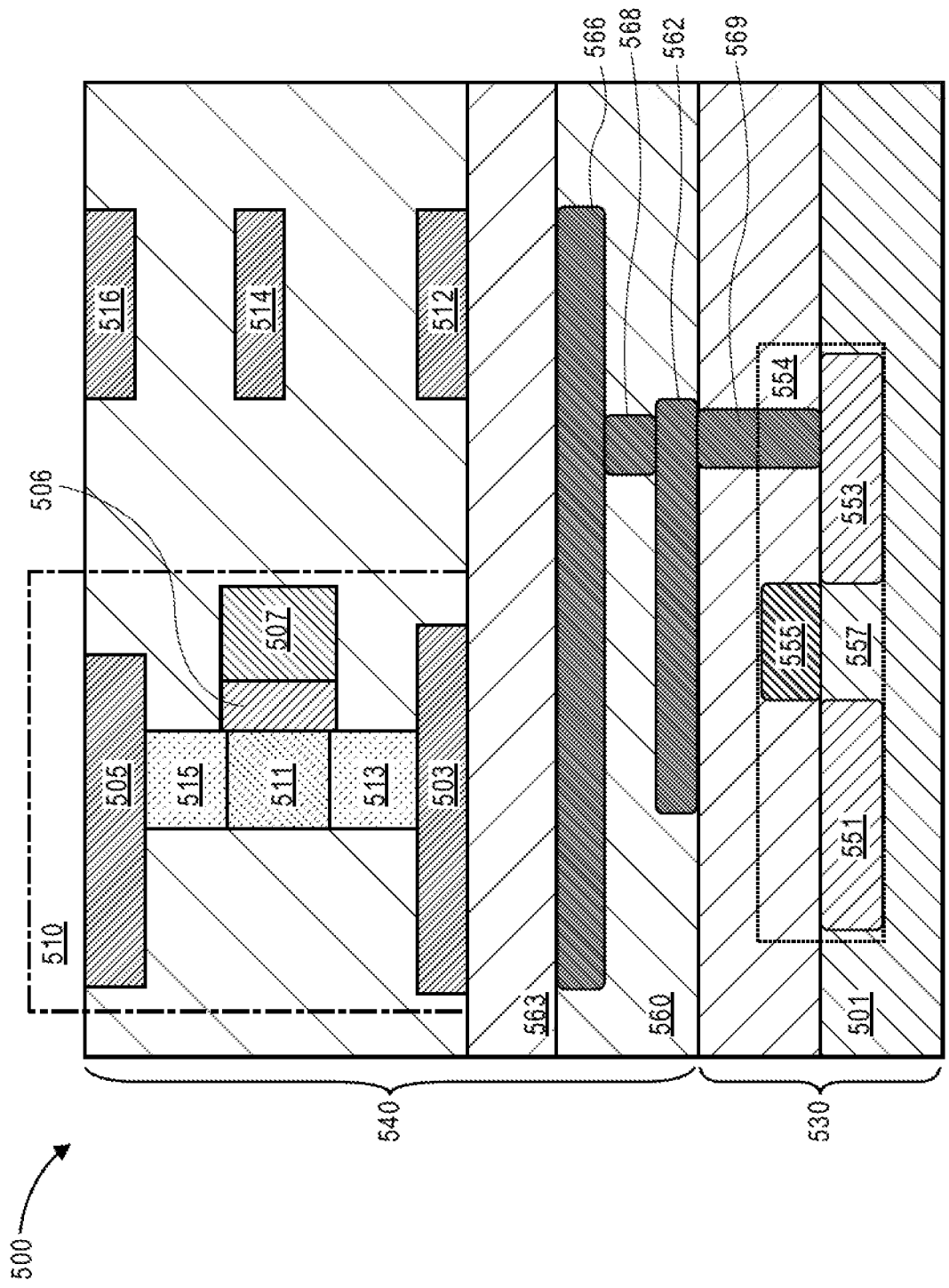
FIG. 5 schematically illustrates a diagram of a semiconductor device including a TFT with a vertical architecture in multiple metal layers formed in back-end-of-line (BEOL) on a substrate, in accordance with some embodiments.

FIG. 5 schematically illustrates a diagram of a semiconductor device 500 including a TFT 510 with a vertical architecture in multiple metal layers formed in BEOL on a substrate, in accordance with some embodiments. The TFT 510 may be an example of the TFT 110 in FIG. 1, the TFT 210, the TFT 220, the TFT 230, or the TFT 240 in FIG. 2, the TFT 310, the TFT 320, or the TFT 330 in FIG. 3.

In embodiments, the TFT 510 may be formed on the substrate 501. The TFT 510 may include metal contacts as a source electrode 503, a drain electrode 505, and a gate electrode 507. The source electrode 503 may be along the first direction, the drain electrode 505 may be along the first direction, in parallel with the source electrode 503. The gate electrode 507 may be along a second direction substantially perpendicular or orthogonal to the first direction. A channel area 511 is in between the source electrode 503 and the drain electrode 505. The gate electrode 507 is aligned with the channel area 511. The gate electrode 507 is separated from the channel area 511 by a gate dielectric layer 506. A source area 513 is between the channel area 511 and the source electrode 503, while a drain area 515 is between the channel area 511 and the drain electrode 505. The source electrode 503 may be located in a metal layer 512, the drain electrode 505 may be located in a metal layer 516, and the gate electrode 507 may be located in a metal layer 514 between the metal layer 512 and the metal layer 516.

In embodiments, the TFT 510 may be formed at the BEOL 540. In addition to the TFT 510, the BEOL 540 may further include a dielectric layer 560, and a dielectric layer 563, where one or more vias, e.g., a via 568, may be connected to one or more metal contacts, e.g., a metal contact 566 and a metal contact 562 within the dielectric layer 560. In embodiments, the metal contact 566 and the metal contact 562 may be of different metal layers at the BEOL 540.

In embodiments, the BEOL 540 may be formed on the FEOL 530. The FEOL 530 may include the substrate 501. In addition, the FEOL 530 may include other devices, e.g., a transistor 554. In embodiments, the transistor 554 may be a FEOL transistor, including a source 551, a drain 553, and a gate 555, with a channel 557 between the source 551 and the drain 553 under the gate 555. Furthermore, the transistor 554 may be coupled to interconnects, e.g., the metal contact 562, through a via 569.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Figure 6:
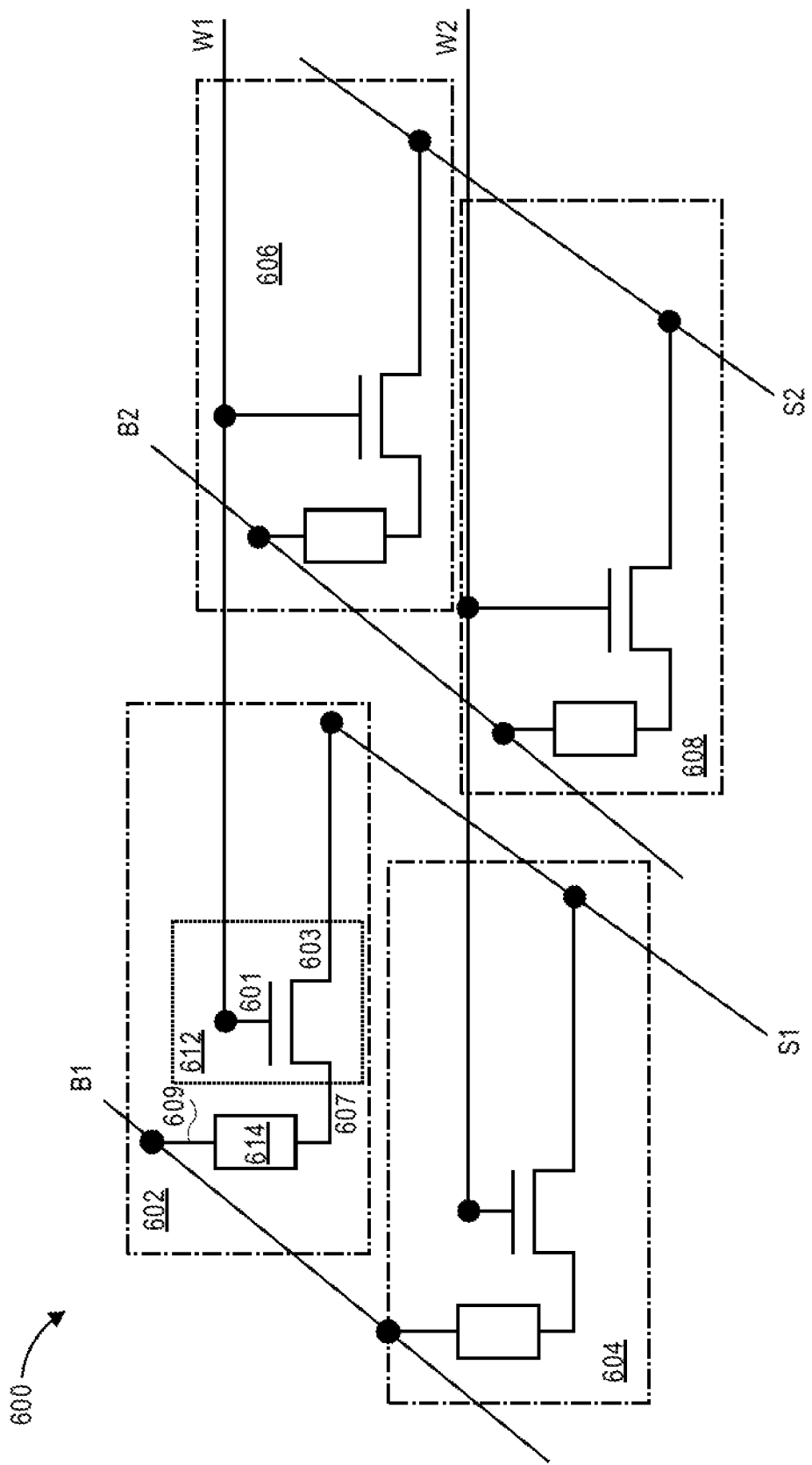
FIG. 6 illustrates a diagram of a random access memory array including multiple memory cells, where a memory cell includes a TFT with a vertical architecture in multiple metal layers, in accordance with some embodiments FIG. 7 schematically illustrates an interposer implementing one or more embodiments of the disclosure, in accordance with some embodiments.

FIG. 6 schematically illustrates a memory array 600 with multiple memory cells (e.g., a memory cell 602, a memory cell 604, a memory cell 606, and a memory cell 608), where a memory cell includes a TFT with a vertical architecture in multiple metal layers, in accordance with some embodiments. In embodiments, the multiple memory cells may be arranged in a number of rows and columns coupled by bit lines, e.g., bit line B1 and bit line B2, and word lines, e.g., word line W1 and word line W2.

A memory cell, e.g., the memory cell 602, may be coupled in series with other memory cells, e.g., the memory cell 606, of the same row, and may be coupled in parallel with the memory cells of other rows, e.g., the memory cell 604 and the memory cell 608. The memory array 600 may include any suitable number of one or more memory cells. Although the memory array 600 is shown in FIG. 6 with two rows that each includes two memory cells coupled in series, other embodiments may include other numbers of rows and/or numbers of memory cells within a row. In some embodiments, the number of rows may be different from the number of columns in a memory array. Each row of the memory array may have a same number of memory cells. Additionally, or alternatively, different rows may have different numbers of memory cells.

In embodiments, multiple memory cells, such as the memory cell 602, the memory cell 604, the memory cell 606, and the memory cell 608, may have a similar configuration. For example, the memory cell 602 may include a selector 612, which may be a transistor, and a storage cell 614. A memory cell may be controlled through the selector coupled to a bit line and a word line to read from the memory cell, write to the memory cell, and/or perform other memory operations. For example, the selector 612 may have an electrode 601 coupled to the word line W1, and the storage cell 614 may have an electrode 609 coupled to the bit line B1. In addition, the selector 612 and the storage cell 614 may be coupled together by the electrode 607, while the selector 612 may have an electrode 603 coupled to a source line S1. When the word line W1 is active, the selector 612 may select the storage cell 614. A signal from the word line W1 may pass through the selector 612, further through the storage cell 614, and reaching the other electrode, which is the bit line B1.

In embodiments, the selector 612 may be a transistor similar to the TFT 110 in FIG. 1, the TFT 210, the TFT 220, the TFT 230, or the TFT 240 in FIG. 2, the TFT 310, the TFT 320, the TFT 330 in FIG. 3, or the TFT 510 in FIG. 5. The electrode 601 may be a gate electrode, e.g., the gate electrode 107, coupled to the word line W1. The electrode 603 may be a source electrode, e.g., the source electrode 103, coupled to a source line. The electrode 607 may be a drain electrode, e.g., the drain electrode 105, coupled to a bit line. The electrode 603 and the electrode 607 may be along the first direction in parallel with each other. The electrode 601 may be along a second direction substantially perpendicular or orthogonal to the first direction.

In various embodiments, the memory cells, e.g., the memory cell 602, the memory cell 604, the memory cell 606, and the memory cell 608, included in the memory array 600 may be formed in BEOL processing. Accordingly, the memory array 600 may be formed in higher metal layers, e.g., metal layer three and/or metal layer four, of the integrated circuit above the active substrate region, and may not occupy the active substrate area that is occupied by conventional transistors or memory devices.

Figure 7:
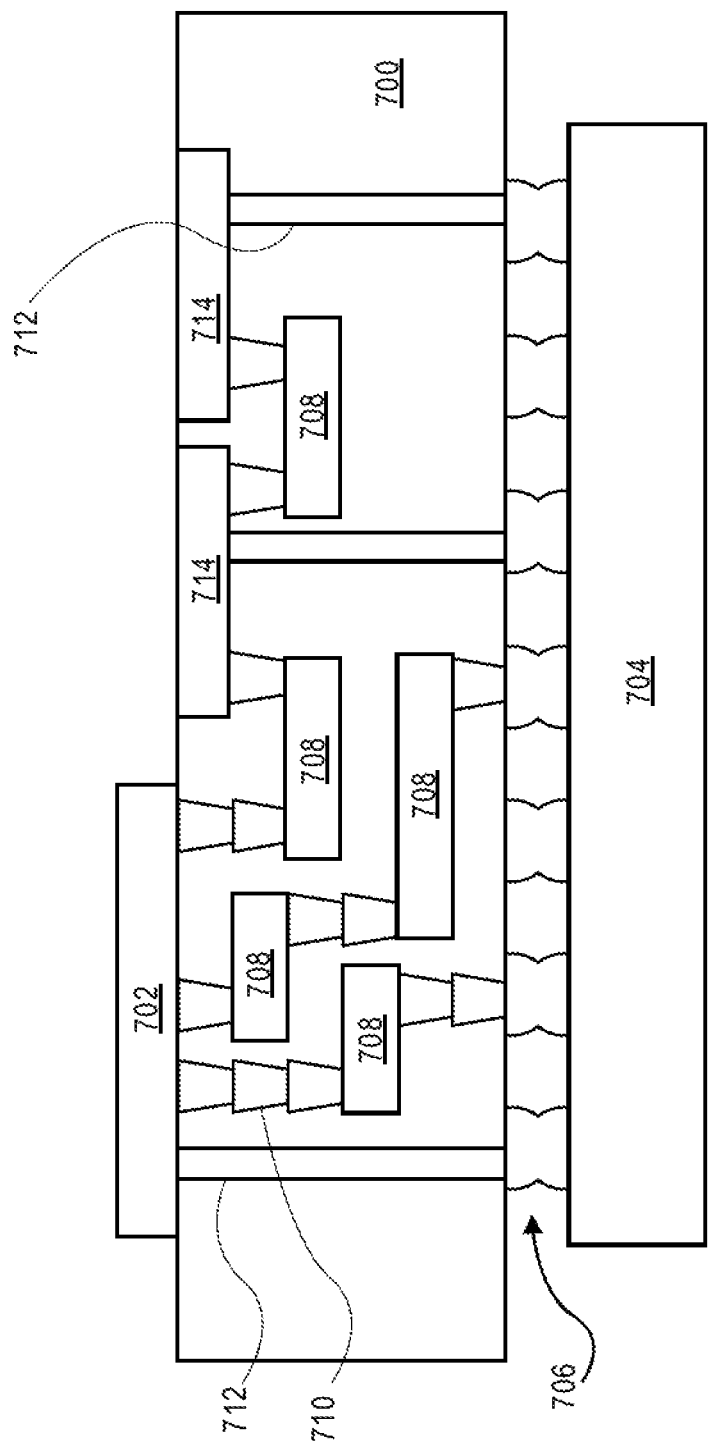

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for the TFT 110 in FIG. 1, the TFT 210, the TFT 220, the TFT 230, or the TFT 240 in FIG. 2, the TFT 310, the TFT 320, the TFT 330 in FIG. 3, or the TFT 510 in FIG. 5. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
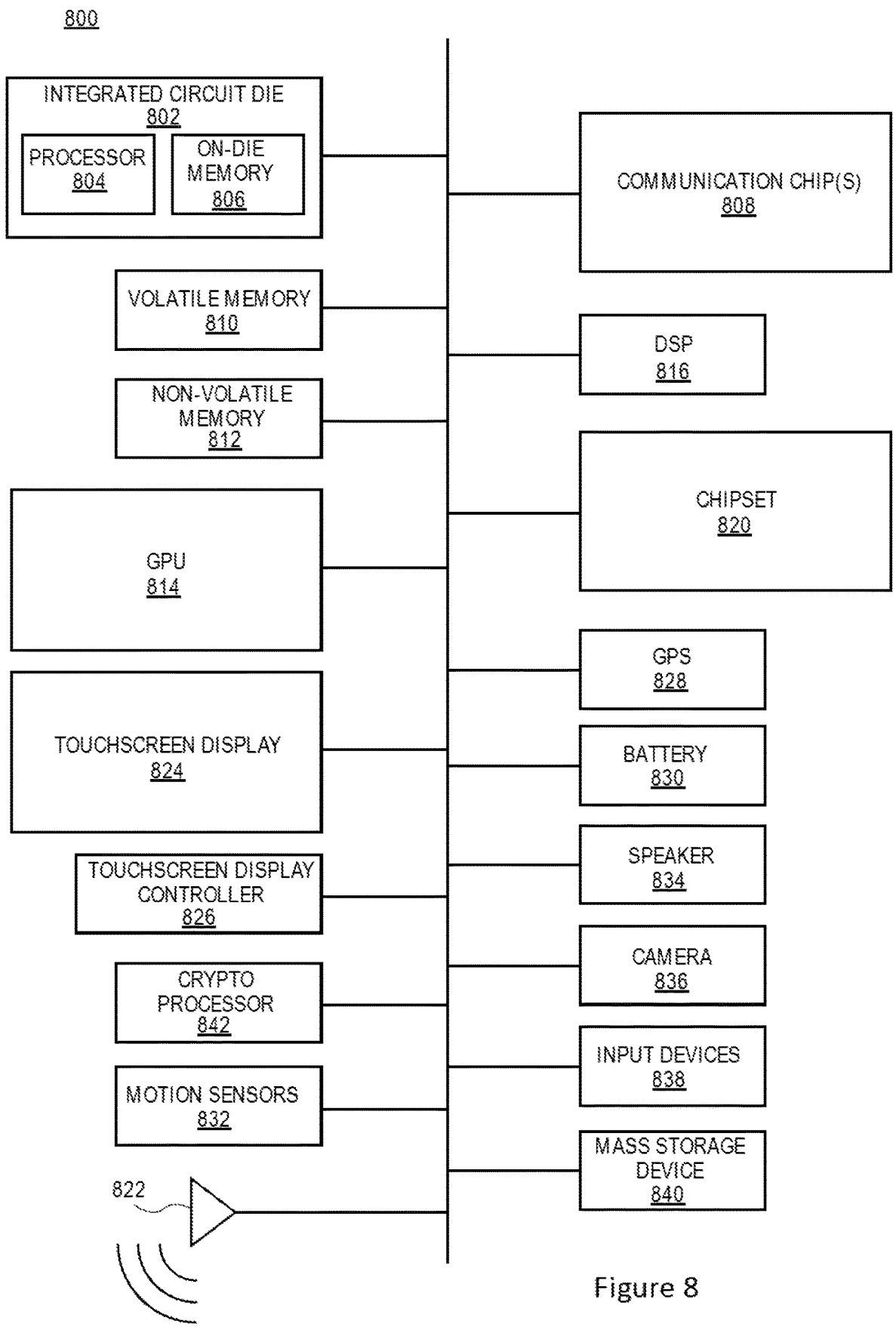
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806, the communications logic unit 808, or the integrated circuit die 802, may include, e.g., the TFT 110 in FIG. 1, the TFT 210, the TFT 220, the TFT 230, or the TFT 240 in FIG. 2, the TFT 310, the TFT 320, the TFT 330 in FIG. 3, or the TFT 510 in FIG. 5.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (µLED) display, or others. For example, the touchscreen display 824 may include e.g., the TFT 110 in FIG. 1, the TFT 210, the TFT 220, the TFT 230, or the TFT 240 in FIG. 2, the TFT 310, the TFT 320, the TFT 330 in FIG. 3, or the TFT 510 in FIG. 5.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

In further embodiments, another component housed within the computing device 800 may contain one or more devices, such as DRAM, that are formed in accordance with implementations of the current disclosure, the TFT 110 in FIG. 1, the TFT 210, the TFT 220, the TFT 230, or the TFT 240 in FIG. 2, the TFT 310, the TFT 320, the TFT 330 in FIG. 3, or the TFT 510 in FIG. 5.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are provided below.

Example 1 may include a semiconductor device, comprising a transistor above a substrate, wherein the transistor includes: a first metal contact as a source electrode, located in a first metal layer along a first direction; a second metal contact as a drain electrode, located in a second metal layer along the first direction, in parallel with the first metal contact; a channel area between the source electrode and the drain electrode; and a third metal contact aligned with the channel area as a gate electrode, located in a third metal layer along a second direction substantially orthogonal to the first direction, wherein the third metal layer is between the first metal layer and the second metal layer.

Example 2 may include the semiconductor device of example 1 and/or some other examples herein, wherein the third metal contact is a first gate electrode, and the transistor further includes: a fourth metal contact as a second gate electrode, located in the third metal layer along the second direction in parallel to the first gate electrode, wherein the channel area is in between the first gate electrode and the second gate electrode.

Example 3 may include the semiconductor device of example 1 and/or some other examples herein, wherein the first metal contact, the second metal contact, and the third metal contact, has a width equal to a minimal feature width for the semiconductor device.

Example 4 may include the semiconductor device of example 1 and/or some other examples herein, wherein the channel area includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 5 may include the semiconductor device of example 1 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 6 may include the semiconductor device of example 1 and/or some other examples herein, wherein the substrate includes a silicon substrate, a glass substrate, a metal substrate, or a plastic substrate.

Example 7 may include the semiconductor device of example 1 and/or some other examples herein, wherein the transistor further includes: a gate dielectric layer between the gate electrode and the channel area.

Example 8 may include the semiconductor device of example 7 and/or some other examples herein, wherein the gate dielectric layer includes silicon and oxygen, silicon and nitrogen, yttrium and oxygen, silicon, oxygen, and nitrogen, aluminum and oxygen, hafnium and oxygen, tantalum and oxygen, or titanium and oxygen.

Example 9 may include the semiconductor device of example 1 and/or some other examples herein, further comprising: a storage element coupled to the transistor to form a memory cell.

Example 10 may include the semiconductor device of example 1 and/or some other examples herein, wherein the transistor is a first transistor, and the semiconductor device further includes a second transistor, and the second transistor includes: a fourth metal contact as a source electrode of the second transistor, located in the first metal layer along the first direction and in parallel with the first metal contact; a fifth metal contact as a drain electrode of the second transistor, located in the second metal layer along the first direction, in parallel with the fourth metal contact and in parallel with the second metal contact; a channel area of the second transistor between the source electrode and the drain electrode of the second transistor; and a sixth metal contact aligned with the channel area as a gate electrode of the second transistor, located in the third metal layer along the second direction substantially orthogonal to the first direction.

Example 11 may include the semiconductor device of example 10 and/or some other examples herein, wherein the fourth metal contact is separated from the first metal contact in the first metal layer along the first direction by a minimal feature width for the semiconductor device.

Example 12 may include the semiconductor device of example 1 and/or some other examples herein, wherein the transistor is a first transistor, and the semiconductor device further includes a second transistor, and the second transistor includes: a fourth metal contact as a source electrode of the second transistor, located in a fourth metal layer along the first direction; a fifth metal contact as a drain electrode of the second transistor, located in a fifth metal layer along the first direction, in parallel with the fourth metal contact; a channel area of the second transistor between the source electrode and the drain electrode of the second transistor; and a sixth metal contact aligned with the channel area as a gate electrode of the second transistor, located in a sixth metal layer along the second direction substantially orthogonal to the first direction, wherein the sixth metal layer is between the fourth metal layer and the fifth metal layer.

Example 13 may include the semiconductor device of example 12 and/or some other examples herein, further comprising: a via to couple the first transistor to the second transistor.

Example 14 may include a method for forming a semiconductor device, the method comprising: forming a first metal contact as a source electrode, located in a first metal layer along a first direction; forming a channel area above the source electrode; forming a second metal contact as a gate electrode aligned with the channel area, located in a second metal layer along a second direction substantially orthogonal to the first direction, wherein the second metal layer is above the first metal layer; and forming a third metal contact as a drain electrode, located in a third metal layer along the first direction, in parallel with the first metal contact, wherein the third metal layer is above the second metal layer.

Example 15 may include the method of example 14 and/or some other examples herein, wherein the second metal contact is a first gate electrode, and the method further comprises: forming a fourth metal contact as a second gate electrode aligned with the channel area, located in the second metal layer along the second direction in parallel to the first gate electrode, wherein the channel area is in between the first gate electrode and the second gate electrode.

Example 16 may include the method of example 14 and/or some other examples herein, further comprising: forming a gate dielectric layer between the gate electrode and the channel area.

Example 17 may include the method of example 14 and/or some other examples herein, wherein the first metal contact, the second metal contact, and the third metal contact, has a width equal to a minimal feature width for the semiconductor device.

Example 18 may include the method of example 14 and/or some other examples herein, wherein the channel area includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si$_2$BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 19 may include the method of example 14 and/or some other examples herein, wherein the first metal contact, the second metal contact, and the third metal contact, are included in a first transistor, and the method further includes: forming a fourth metal contact as a source electrode of a second transistor, located in the first metal layer along the first direction and in parallel with the first metal contact; forming a channel area of the second transistor above the source electrode of the second transistor; forming a fifth metal contact aligned with the channel area as a gate electrode of the second transistor, located in the second metal layer along the second direction orthogonal to the first direction; and forming a sixth metal contact as a drain electrode of the second transistor, located in the third metal layer along the first direction, in parallel with the fourth metal contact.

Example 20 may include the method of example 19 and/or some other examples herein, wherein the fourth metal contact is separated from the first metal contact in the first metal layer along the first direction by a minimal feature width for the semiconductor device.

Example 21 may include a computing device comprising: a circuit board; and a memory device coupled to the circuit board and including a memory array, wherein the memory array includes a plurality of memory cells, a memory cell of the plurality of memory cells includes a transistor coupled to a storage cell, and wherein the transistor includes: a first metal contact as a source electrode, located in a first metal layer along a first direction and coupled to a source line of the memory array; a second metal contact as a drain electrode, located in a second metal layer along the first direction, in parallel with the first metal contact and coupled to a first electrode of the storage cell; a channel area between the source electrode and the drain electrode; and a third metal contact aligned with the channel area as a gate electrode coupled to a word line of the memory array, located in a third metal layer along a second direction substantially orthogonal to the first direction, wherein the third metal layer is between the first metal layer and the second metal layer; and the storage cell further includes a second electrode coupled to a bit line of the memory array.

Example 22 may include the method of example 21 and/or some other examples herein, wherein the first metal contact, the second metal contact, and the third metal contact, has a width equal to a minimal feature width for the semiconductor device.

Example 23 may include the method of example 21 and/or some other examples herein, wherein the channel area includes amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si$_2$BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC).

Example 24 may include the method of example 21 and/or some other examples herein, wherein the gate electrode, the source electrode, or the drain electrode includes titanium (Ti), molybdenum (Mo), gold (Au), platinum (Pt), aluminum (Al), nickel (Ni), copper (Cu), chromium (Cr), or an alloy of Ti, Mo, Au, Pt, Al Ni, Cu, Cr, TiAlN, HfAlN, or InAlO.

Example 25 may include the method of example 21 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
 a transistor above a substrate, wherein the transistor includes:
  a first metal contact as a source electrode, located in a first metal layer along a first direction;
  a second metal contact as a drain electrode, located in a second metal layer along the first direction, in parallel with the first metal contact;
  a channel area between a source region and a drain region, the source region adjacent to the source electrode, and the drain region adjacent to the drain electrode;
  a third metal contact aligned with the channel area as a first gate electrode, located in a third metal layer along a second direction substantially orthogonal to the first direction, wherein the third metal layer is between the first metal layer and the second metal layer, and wherein one or both of the source electrode or the drain electrode extends laterally beyond the first gate electrode along the first direction; and
  a fourth metal contact as a second gate electrode, located in the third metal layer along the second direction in parallel to the first gate electrode, wherein the channel area is between the first gate electrode and the second gate electrode, and wherein the second gate electrode is laterally spaced apart and separate from the first gate electrode; and
 an interconnect structure above the substrate, wherein the interconnect structure includes:
  a first metal line in the first metal layer, the first metal line laterally spaced apart from the source electrode by an interlayer dielectric (ILD) layer;
  a second metal line in the third metal layer, the second metal line laterally spaced apart from the first gate electrode by an etch stop layer; and
  a conductive via laterally spaced apart from the source region by the ILD layer, the conductive via directly coupling the first metal line to the second metal line.

2. The semiconductor device of claim 1, wherein the first metal contact, the second metal contact, and the third metal contact, has a width equal to a feature width for the semiconductor device.

3. The semiconductor device of claim 1, wherein the channel area includes a material selected from the group consisting of amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, and C-Axis Aligned Crystal (CAAC).

4. The semiconductor device of claim 1, wherein one of the first gate electrode, the second gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), and an alloy of Ti, Mo, Au, Pt, Al, Ni, Cu, Cr, TiAlN, HfAlN, or InAlO.

5. The semiconductor device of claim 1, wherein the substrate includes a material selected from the group consisting of a silicon substrate, a glass substrate, a metal substrate, and a plastic substrate.

6. The semiconductor device of claim 1, wherein the transistor further includes:
 a first gate dielectric layer between the first gate electrode and the channel area, and a second gate dielectric between the second gate electrode and the channel area.

7. The semiconductor device of claim 6, wherein the first gate dielectric layer or the second gate dielectric layer includes a material selected from the group consisting of silicon and oxygen, silicon and nitrogen, yttrium and oxygen, silicon and oxygen and nitrogen, aluminum and oxygen, hafnium and oxygen, tantalum and oxygen, and titanium and oxygen.

8. The semiconductor device of claim 1, further comprising:
 a storage element coupled to the transistor to form a memory cell.

9. The semiconductor device of claim 1, wherein the transistor is a first transistor, and the semiconductor device further includes a second transistor, and the second transistor includes:
 a fifth metal contact as a source electrode of the second transistor, located in the first metal layer along the first direction and in parallel with the first metal contact;
 a sixth metal contact as a drain electrode of the second transistor, located in the second metal layer along the first direction, in parallel with the fifth metal contact and in parallel with the second metal contact;
 a channel area of the second transistor between the source electrode and the drain electrode of the second transistor; and
 a seventh metal contact aligned with the channel area as a gate electrode of the second transistor, located in the third metal layer along the second direction substantially orthogonal to the first direction.

10. The semiconductor device of claim 9, wherein the fifth metal contact is separated from the first metal contact in the first metal layer along the first direction by a feature width for the semiconductor device.

11. The semiconductor device of claim 1, wherein the transistor is a first transistor, and the semiconductor device further includes a second transistor, and the second transistor includes:
- a fifth metal contact as a source electrode of the second transistor, located in a fourth metal layer along the first direction;
- a sixth metal contact as a drain electrode of the second transistor, located in a fifth metal layer along the first direction, in parallel with the fifth metal contact;
- a channel area of the second transistor between the source electrode and the drain electrode of the second transistor; and
- a seventh metal contact aligned with the channel area as a gate electrode of the second transistor, located in a sixth metal layer along the second direction substantially orthogonal to the first direction, wherein the sixth metal layer is between the fourth metal layer and the fifth metal layer.

12. The semiconductor device of claim 11, further comprising:
- a via to couple the first transistor to the second transistor.

13. A method for forming a semiconductor device, the method comprising:
- forming a first metal contact as a source electrode, located in a first metal layer along a first direction;
- forming a channel area above the source electrode, the channel area between a source region and a drain region, the source region adjacent to the source electrode;
- forming a second metal contact as a first gate electrode aligned with the channel area, located in a second metal layer along a second direction substantially orthogonal to the first direction, wherein the second metal layer is above the first metal layer;
- forming a third metal contact as a second gate electrode, located in the second metal layer along the second direction in parallel to the first gate electrode, wherein the channel area is between the first gate electrode and the second gate electrode, and wherein the second gate electrode is laterally spaced apart and separate from the first gate electrode;
- forming a fourth metal contact as a drain electrode adjacent to the drain region, located in a third metal layer along the first direction, in parallel with the first metal contact, wherein the third metal layer is above the second metal layer, and wherein one or both of the source electrode or the drain electrode extends laterally beyond the gate electrode along the first direction; and
- forming an interconnect structure, wherein forming the interconnect structure comprises:
  - forming a first metal line in the first metal layer, the first metal line laterally spaced apart from the source electrode by an interlayer dielectric (ILD) layer;
  - forming a second metal line in the third metal layer, the second metal line laterally spaced apart from the first gate electrode by an etch stop layer; and
  - forming a conductive via laterally spaced apart from the source region by the ILD layer, the conductive via directly coupling the first metal line to the second metal line.

14. The method of claim 13, further comprising:
- forming a first gate dielectric layer between the first gate electrode and the channel area, and forming a second gate dielectric layer between the second gate electrode and the channel area.

15. The method of claim 13, wherein the first metal contact, the second metal contact, and the third metal contact, has a width equal to a minimal feature width for the semiconductor device.

16. The method of claim 13, wherein the channel area includes a material selected from the group consisting of amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, and C-Axis Aligned Crystal (CAAC).

17. The method of claim 13, wherein the first metal contact, the second metal contact, and the third metal contact, are included in a first transistor, and the method further includes:
- forming a fifth metal contact as a source electrode of a second transistor, located in the first metal layer along the first direction and in parallel with the first metal contact;
- forming a channel area of the second transistor above the source electrode of the second transistor;
- forming a sixth metal contact aligned with the channel area as a gate electrode of the second transistor, located in the second metal layer along the second direction orthogonal to the first direction; and
- forming a seventh metal contact as a drain electrode of the second transistor, located in the third metal layer along the first direction, in parallel with the fifth metal contact.

18. The method of claim 17, wherein the fifth metal contact is separated from the first metal contact in the first metal layer along the first direction by a minimal feature width for the semiconductor device.

19. A computing device comprising:
- a circuit board; and
- a memory device coupled to the circuit board and including a memory array, wherein the memory array includes a plurality of memory cells, a memory cell of the plurality of memory cells includes a transistor and an interconnect structure, the transistor coupled to a storage cell, and wherein the transistor includes:
  - a first metal contact as a source electrode, located in a first metal layer along a first direction and coupled to a source line of the memory array;
  - a second metal contact as a drain electrode, located in a second metal layer along the first direction, in parallel with the first metal contact and coupled to a first electrode of the storage cell;
  - a channel area between a source region and a drain region, the source region adjacent to the source electrode, and the drain region adjacent to the drain electrode; and
  - a third metal contact aligned with the channel area as a first gate electrode coupled to a word line of the memory array, located in a third metal layer along a second direction substantially orthogonal to the first direction, wherein the third metal layer is between the first metal layer and the second metal layer, and wherein one or both of the source electrode or the drain electrode extends laterally beyond the gate electrode along the first direction; and a fourth metal contact as a second gate electrode, located in the third metal layer along the second direction in parallel to the first gate electrode, wherein the channel area is between the first gate electrode and the second gate electrode, and wherein the second gate electrode is laterally spaced apart and separate from the first gate electrode;

and wherein the interconnect structure includes:

an interconnect structure above the substrate, the interconnect structure comprising:

a first metal line in the first metal layer, the first metal line laterally spaced apart from the source electrode by an interlayer dielectric (ILD) layer;

a second metal line in the third metal layer, the second metal line laterally spaced apart from the first gate electrode by an etch stop layer; and a conductive via laterally spaced apart from the source region by the ILD layer, the conductive via directly coupling the first metal line to the second metal line; and wherein the storage cell further includes a second electrode coupled to a bit line of the memory array.

20. The computing device of claim 19, wherein the first metal contact, the second metal contact, and the third metal contact, has a width equal to a feature width for the semiconductor device.

21. The computing device of claim 19, wherein the channel area includes a material selected from the group consisting of amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, and C-Axis Aligned Crystal (CAAC).

22. The computing device of claim 19, wherein the first gate electrode, the second gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), and an alloy of Ti, Mo, Au, Pt, Al, Ni, Cu, Cr, TiAlN, HfAlN, or InAlO.

23. The computing device of claim 19, wherein the computing device is a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the circuit board.

\* \* \* \* \*